(12) United States Patent
Rajendran (10) Patent No.: US 8,778,231 B2
(45) Date of Patent: Jul. 15, 2014

(54) ALUMINUM PASTES COMPRISING BORON NITRIDE AND THEIR USE IN MANUFACTURING SOLAR CELLS

(75) Inventor: Raj G. Rajendran, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 255 days.

(21) Appl. No.: 12/969,983

(22) Filed: Dec. 16, 2010

(65) Prior Publication Data

US 2012/0152345 A1   Jun. 21, 2012

(51) Int. Cl.
*H01B 1/02* (2006.01)

(52) U.S. Cl.
USPC .................. 252/512; 427/96.1; 136/252

(58) Field of Classification Search
USPC .............. 252/500, 512; 106/287.17; 427/96.1; 136/252
See application file for complete search history.

(56) References Cited

U.S. PATENT DOCUMENTS

| | | | | |
|---|---|---|---|---|
| 3,575,858 | A * | 4/1971 | Adair et al. ................ | 508/126 |
| 5,445,308 | A * | 8/1995 | Nelson et al. ................ | 228/121 |
| 6,695,903 | B1 | 2/2004 | Kubelbeck et al. | |
| 7,718,092 | B2 | 5/2010 | Rose et al. | |
| 2003/0158294 | A1 * | 8/2003 | Chaudhuri et al. ........... | 523/205 |
| 2007/0079868 | A1 | 4/2007 | Rose et al. | |
| 2007/0215202 | A1 | 9/2007 | Salami et al. | |
| 2007/0221270 | A1 | 9/2007 | Watsuji et al. | |
| 2007/0269923 | A1 | 11/2007 | Lee et al. | |
| 2008/0268637 | A1 | 10/2008 | Inaba | |
| 2009/0101190 | A1 * | 4/2009 | Salami et al. ................ | 136/244 |
| 2009/0255583 | A1 | 10/2009 | Young et al. | |
| 2010/0173446 | A1 | 7/2010 | Khadilkar et al. | |

FOREIGN PATENT DOCUMENTS

| | | |
|---|---|---|
| CN | 1901234 A | 1/2007 |
| GB | 1441433 | 6/1976 |
| JP | 3233805 A | 10/1991 |
| JP | 09191118 A | 7/1997 |
| JP | 2003069056 A | 3/2003 |
| JP | 2009194141 A | 8/2009 |
| WO | 2006134086 A1 | 12/2006 |
| WO | 2007032151 A1 | 3/2007 |
| WO | 2009009512 A1 | 1/2009 |

* cited by examiner

*Primary Examiner* — Mark Kopec
*Assistant Examiner* — William Young (57) ABSTRACT

Disclosed are aluminum paste compositions, processes to form solar cells using the aluminum paste compositions, and the solar cells so-produced. The aluminum paste compositions comprise 0.003% to 9%, by weight of boron nitride; 27% to 89%, by weight of an aluminum powder, such that the weight ratio of aluminum powder to boron nitride is in the range of 9:1 to 9909:1; and 0.1% to 9%, by weight of an optional glass frit-free additive, the optional glass frit-free additive comprising amorphous silicon dioxide, crystalline calcium oxide organometallic compounds, metal salts, or mixtures thereof; and 10% to 70%, by weight of an organic vehicle, wherein the amounts in % by weight are based on the total weight of the aluminum paste composition.

6 Claims, 1 Drawing Sheet

ALUMINUM PASTES COMPRISING BORON NITRIDE AND THEIR USE IN MANUFACTURING SOLAR CELLS

FIELD OF THE INVENTION

The present invention relates to aluminum paste compositions and their use as backside pastes in the manufacture of solar cells.

TECHNICAL BACKGROUND

Currently, most of the electric power-generating solar cells are silicon solar cells. A conventional silicon solar cell structure has a large area p-n junction made from a p-type silicon wafer, a negative electrode that is typically on the front-side or sun-side of the cell, and a positive electrode on the back-side. It is well-known that radiation of an appropriate wavelength falling on a p-n junction of a semiconductor body serves as a source of external energy to generate hole-electron pairs in that body. The potential difference that exists at a p-n junction causes holes and electrons to move across the junction in opposite directions and thereby gives rise to flow of an electric current that is capable of delivering power to an external circuit.

Process flow in mass production of solar cells is generally aimed at achieving maximum simplification and minimization of manufacturing costs. Electrodes in particular are made by using methods such as screen printing from a metal paste. During the formation of a silicon solar cell, an aluminum paste is generally screen printed and dried on the back-side of the silicon wafer. The wafer is then fired at a temperature above the melting point of aluminum to form an aluminum-silicon melt, subsequently, during the cooling phase, an epitaxially grown layer of silicon is formed that is doped with aluminum. This layer is generally called the back surface field (BSF) layer, and helps to improve the energy conversion efficiency of the solar cell. However, due to the lack of a high quality passivation layer, the current state-of-the-art cells still suffer from recombination of photogenerated carriers, either within the BSF layer, or at the back surface of the cell. This loss of photo-generated carriers leads to a loss in efficiency.

Furthermore, in an attempt to reduce total manufacturing cost of the silicon solar cells, thinner silicon wafers are being used. However, the use of silicon wafers thinner than 200 microns can lead to an increase in bowing of the silicon substrate, and hence the solar cell, due to the difference in coefficient of thermal expansion of the metal electrode material and the silicon substrate.

Hence, there is a need for back-side aluminum paste compositions and methods of making solar cells using the back-side aluminum paste compositions to decrease bowing and improve efficiency of the solar cells.

SUMMARY

Disclosed are aluminum paste compositions consisting essentially of:
(a) 0.003% to 9% by weight boron nitride;
(b) 27% to 89%, by weight aluminum powder, such that the weight ratio of aluminum powder to boron nitride is in the range of 9:1 to 9909:1;
(c) 0.1% to 9%, by weight optional glass frit-free additive wherein the optional glass frit-free additive comprises amorphous silicon dioxide, crystalline calcium oxide, organometallic compounds, metal salts, or mixtures thereof; and
(d) 10% to 70%, by weight of an organic vehicle, wherein the amounts in % by weight are based on the total weight of the aluminum paste composition.

Also disclosed herein are solar cells comprising:
(a) a p-type silicon substrate comprising a p-type region disposed between an n-type region and a p+ layer, wherein the p+ layer comprises boron and aluminum;
(b) an aluminum back electrode disposed on the p+ layer, wherein the alumnum back electrode comprises 0.01% to 10% of boron nitride and 90% to 99.99% of aluminum, by weight, based on the total weight of the aluminum back electrode; and
(c) a metal front electrode disposed on a portion of the n-type region.

Also disclosed herein are processes for forming a silicon solar cell, comprising:
(a) providing an aluminum paste, the aluminum paste consisting essentially of 0.003% to 9% by weight of boron nitride; 27% to 89%, by weight of an aluminum powder, such that the weight ratio of aluminum powder to boron nitride is in the range of 9:1 to 9909:1; and 0.1% to 9%, by weight of optional glass frit-free additive, the optional glass frit-free additive comprising amorphous silicon dioxide, crystalline calcium oxide, organometallic compounds, metal salts, or mixtures thereof; and 10% to 70%, by weight of an organic vehicle, wherein the amounts in % by weight are based on the total weight of the aluminum paste composition;
(b) applying the aluminum paste on a back-side of a p-type silicon substrate;
(c) applying a metal paste on a front-side of the p-type silicon substrate, the front-side being opposite to the back-side;
(d) firing the p-type silicon substrate after the application of the aluminum paste at a peak temperature in the range of 600° C. to 950° C.; and
(e) firing the p-type silicon substrate after the application of the metal paste at a peak temperature in the range of 600° C. to 950° C.

BRIEF DESCRIPTION OF THE FIGURES

Reference numerals shown in FIGS. 1-4 are explained below:
- 100, 200, 300: silicon wafer at various stages in the making of a solar cell
- 400: solar cell
- 101: front-side of the silicon wafer
- 401: front-side or the sun-side of the solar cell
- 102, 302: back-side of the silicon wafer
- 110, 210, 310, 410: p-type region of the silicon wafer
- 115: p-n junction
- 120, 220, 320, 420: n-type region of the silicon wafer
- 230, 330, 430: antireflective coating (ARC) layer, for example, $SiN_x$, $TiO_x$, or $SiO_x$
- 350: front-side metal paste, for example, silver paste 451: metal front electrode (obtained by firing front-side metal paste), for example, silver electrodes
360: back-side aluminum paste
461: aluminum back electrode (obtained by firing back-side aluminum paste)
440: p+ layer or the back surface field (BSF)

DETAILED DESCRIPTION

Disclosed are aluminum paste compositions consisting essentially of boron nitride, an aluminum powder, an optional glass frit-free additive, and an organic vehicle, the optional glass frit-free additive comprising amorphous silicon dioxide, crystalline calcium oxide, organometallic compounds, metal salts, or mixtures thereof.

Suitable boron nitride includes amorphous boron nitride, cubic boron nitride, hexagonal boron nitride, and mixtures thereof. The boron nitride is present in the aluminum pastes in an amount ranging from 0.003% to 9%, or 0.005% to 8%, or 0.1% to 3%, by weight, based on the total weight of the aluminum paste composition. In an embodiment, the boron nitride has a particle size, $d_{50}$ of 0.1 microns to 10 microns, or 0.5 microns to 6 microns. The particle size of the boron nitride can be measured using any suitable technique, such as, laser light scattering.

As used herein, the particle sizes refer to cumulative particle size distributions based on volume and assuming spherical particles. Hence, the particle size $d_{50}$ is the median particle size, such that 50% of the total volume of the sample of particles comprises particles having volume smaller than the volume of a sphere having a diameter of $d_{50}$.

Suitable aluminum powder includes aluminum particles such as, flake aluminum, spherical aluminum, nodular aluminum, irregularly-shaped aluminum powder, or any combination thereof. In some embodiments, the aluminum powder has a particle size, $d_{50}$ of 1 micron to 10 microns, or 2 microns to 8 microns. In some embodiments, the aluminum powder is a mixture of aluminum powders of different particle sizes. For example, aluminum powder having particle size, $d_{50}$ in the range of 1 micron to 3 microns can be mixed with an aluminum powder having particle size, $d_{50}$ in the range of 5 microns to 10 microns. The aluminum powder is present in the aluminum paste in an amount ranging from 27% to 89%, or 45% to 79%, by weight, based on the total weight of the aluminum paste composition.

In one embodiment, the aluminum powders have an aluminum content of from 99.5 weight % to 100 weight %. In another embodiment, the aluminum powders further comprise other particulate metal(s), for example silver or silver alloy powders. The proportion of such other particulate metal(s) can be from 0.01% to 10%, or from 0.5% to 9.5%, or from 1% to 9%, by weight, based on the total weight of the aluminum powder including particulate metal(s).

In some embodiments, the aluminum paste composition also comprises optional glass frit-free additive at a concentration of 0.05% to 9%, or 0.25% to 6%, or 0.5% to 3%, by weight, based on the total weight of the aluminum paste composition.

As used herein, the phrase "glass frit-free additive" refers to an additive without glass frit or in other words, any additive excluding glass frit, wherein "glass frit" includes aluminosilicate glass frit; borosilicate glass frit; lead borosilicate glass frit; bismuth cadmium, barium, calcium, or other alkaline earth borosilicate glass frit; and combinations of oxides, such as $B_2O_3$, $SiO_2$, $Al_2O_3$, $Bi_2O_3$, CdO, CaO, BaO, ZnO, $Na_2O$, $Li_2O$, PbO, and $ZrO_2$, which can be used to form glass frit.

Suitable optional glass frit-free additives include amorphous silicon dioxide, crystalline calcium oxide, organometallic compounds, boron nitride, metal salts, and mixtures thereof.

If present, the amorphous silicon dioxide is in the form of a finely divided powder. The amorphous silicon dioxide powder has a particle size, $d_{50}$ of 5 nm to 1000 nm or 10 nm to 500 nm. In some embodiments, the amorphous silicon dioxide is a synthetically produced silica, for example, pyrogenic silica or silica produced by precipitation.

Amorphous silicon dioxide can be present in the aluminum paste composition in the range of 0.001% to 0.5%, or 0.01% to 0.5%, or 0.05% to 0.1%, by weight, based on the total weight of the aluminum paste composition.

The crystalline calcium oxide can be present in the aluminum paste composition in the range of 0.03% to 9%, or 0.05% to 8%, by weight, based on the total weight of the aluminum paste composition. In an embodiment, the crystalline calcium oxide has a particle size, $d_{50}$ of 0.1 microns to 10 microns, or 0.5 microns to 6 microns.

As used herein, the organometallic compounds include compounds with metal-carbon bonds and salts containing metal cations and organic anions. Suitable organometallic compound includes zinc neodecanoate, tin octoate, calcium octoate, and mixtures thereof. The organometallic compound and mixtures thereof can be present in the aluminum paste composition in the range of 0.001% to 3%, or 0.01% to 2%, or 0.05% to 1%, by weight, based on the total weight of the aluminum paste composition.

Specific examples of metal salts include calcium magnesium carbonate, calcium carbonate, calcium oxalate, calcium pyrophosphate, and bismuth phosphate. Each of these metal salts can be present in the aluminum paste composition in the range of 0.1% to 7.0%, or 0.5% to 5.0%, or 1.0% to 3.0%, by weight, based on the total weight of the aluminum paste composition.

The total solid content, including aluminum powder, boron nitride, and solid optional glass frit-free additive(s), of the aluminum paste composition is in the range of 30% to 90%, or 50% to 80%, by weight, based on the total weight of the aluminum paste composition. Furthermore, the solid content of the aluminum paste composition comprises aluminum powder present in an amount of 90% to 99.99%, or 94% to 99%, boron nitride present in an amount of 0.01% to 10% or 0.1% to 6%, and optional glass frit-free additive present in an amount of 0.1 to 9%, by weight, wherein the solid content includes aluminum powder, boron nitride, and other solid optional glass frit-free additive(s). Additionally, the weight ratio of aluminum powder to boron nitride is in the range of 9:1 to 9909:1

The aluminum paste composition also comprises an organic vehicle at a concentration of 10% to 70%, or 20% to 50%, by weight, based on the total weight of the aluminum paste composition. The amount of organic vehicle in the aluminum paste composition is dependent on several factors, such as the method to be used in applying the aluminum paste and the chemical constituents of the organic vehicle used. Organic vehicle includes one or more of solvents, binders, surfactants, thickeners, rheology modifiers, and stabilizers to provide one or more of: stable dispersion of insoluble solids; appropriate viscosity and thixotropy for application, in particular, for screen printing; appropriate wettability of the silicon substrate and the paste solids; a good drying rate; and good firing properties. Suitable organic vehicles include organic solvents, organic acids, waxes, oils, esters, and combinations thereof. In some embodiments, the organic vehicle is a nonaqueous inert liquid, an organic solvent, or an organic solvent mixture, or a solution of one or more organic polymers in one or more organic solvents. Suitable organic polymers include ethyl cellulose, ethylhydroxyethyl cellulose, wood rosin, phenolic resins, poly(meth)acrylates of lower alcohols, and combinations thereof. Suitable organic solvents include ester alcohols and terpenes such as alpha- or beta-terpineol and mixtures thereof with other solvents such as kerosene, dibutylphthalate, diethylene glycol butyl ether, diethylene glycol butyl ether acetate, hexylene glycol, high boiling alcohols, and mixtures thereof. The organic vehicle can also comprise volatile organic solvents for promoting rapid hardening after deposition of the aluminum paste on the back-side of the silicon wafer. Various combinations of these and other solvents can be formulated to obtain the desired viscosity and volatility.

The aluminum paste compositions are typically viscous compositions and can be prepared by mechanically mixing the aluminum powder, boron nitride, and the optional additives with the organic vehicle. In one embodiment, the manufacturing method of high shear power mixing—a dispersion technique that is equivalent to the traditional roll milling—is used. In other embodiments, roll milling or other high shear mixing techniques are used.

In various embodiments, the aluminum paste compositions are used in the manufacture of aluminum back electrodes of silicon solar cells or respectively in the manufacture of silicon solar cells.

As used herein, the phrase "silicon solar cell" is used interchangeably with "solar cell", "cell", "silicon photovoltaic cell", and "photovoltaic cell".

Figure 1:
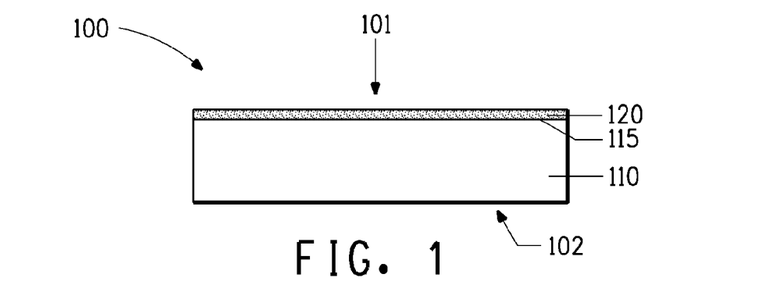
FIG. 1 schematically illustrates a cross-sectional view of a silicon wafer comprising a p-type region, an n-type region on a front-side, a p-n junction, and a back-side opposite the front-side.

FIGS. 1-4 schematically illustrate a process of forming a silicon solar cell in accordance with various embodiments of this invention. The process of forming a silicon solar cell comprises providing a p-type silicon wafer 100. The silicon wafer can be a single crystalline silicon substrate or a polycrystalline silicon substrate. The silicon wafer 100 can have a thickness from 160 microns to 300 microns. As shown in FIG. 1, the silicon wafer 100 includes a p-type region 110 including p-type dopants, an n-type region 120 including n-type dopants, a p-n junction 115, a front-side 101 or the sun-side, and a back-side 102 opposite the front-side 101. The front-side 101 is also termed the sun-side as it is the light-receiving face (surface) of the solar cell. Conventional cells have the p-n junction close to the sun side and have a junction depth in the range of 0.05 microns and 0.5 microns.

Figure 2:
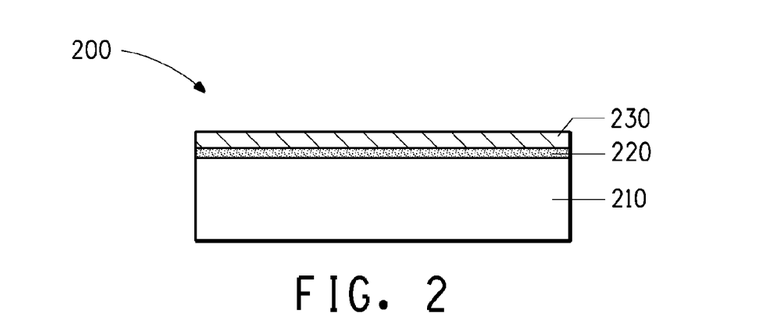
FIG. 2 schematically illustrates a cross-sectional view of a silicon wafer comprising a layer of antireflective coating (ARC) on an n-type region.

In one embodiment, the process of forming a silicon solar cell further comprises forming a layer of optional antireflective coating (ARC) 230 on the n-type region 220 of the silicon wafer 200, as shown in FIG. 2. Any suitable method can be used for the deposition of the antireflective coating, such as chemical vapor deposition (CVD) or plasma enhanced chemical vapor deposition (PECVD). Suitable examples of antireflective coating (ARC) materials include silicon nitride ($SiN_x$), titanium oxide ($TiO_x$), and silicon oxide ($SiO_x$).

The process of forming a silicon solar cell also comprises providing an aluminum paste composition as disclosed hereinabove.

Figure 3:
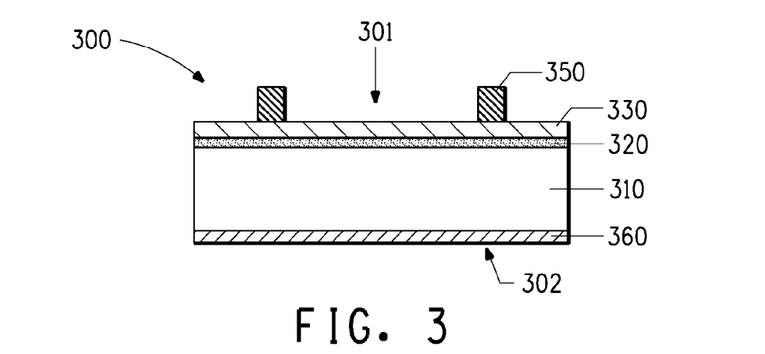
FIG. 3 schematically illustrates a cross-sectional view of a silicon wafer comprising a layer of front-side metal paste disposed over an antireflective coating (ARC) layer and an aluminum paste layer disposed on a p-type region.

The process of forming a silicon solar cell further comprises applying the aluminum paste on the back-side of a p-type silicon wafer. For example, FIG. 3 shows an aluminum paste layer 360 disposed on the p-type region 310 disposed on the back-side of a silicon wafer 300. The aluminum paste compositions can be applied such that the wet weight (i.e., weight of the solids and the organic vehicle) of the applied aluminum paste is in the range of 4 mg/cm² to 9.5 mg/cm² or 5.5 mg/cm² to 8 mg/cm², and the corresponding dry weight of the aluminum paste is the range of 3 mg/cm² to 7 mg/cm² or 4 mg/cm² to 6 mg/cm². Any suitable method can be used for the application of aluminum paste, such as silicone pad printing or screen printing. In various embodiments, the application viscosity of the aluminum paste as disclosed hereinabove is in the range of 20 Pa·s to 200 Pa·s, or 50 Pa·s to 180 Pa·s, or 70 Pa·s to 150 Pa·s. After application of the back-side aluminum paste 360 to the back-side 302 of the silicon wafer 300, it may be dried, for example, for a period of 1 minute to 120 minutes, or 2 minutes to 100 minutes, or 5 minutes to 90 minutes at a peak temperature in the range of 100° C. to 400° C. Any suitable method can be used for drying, including, for example making use of belt, rotary or stationary driers, in particular, IR (infrared) belt driers. The actual drying time and drying temperature depend on various factors, such as aluminum paste composition, thickness of the aluminum paste layer, and drying method. For example, for the same aluminum paste composition, the temperature range for drying in a box furnace can be in the range of 100° C. to 200° C., while for a belt furnace it can be in the range of 200° C. to 400° C.

The process of forming a silicon solar cell further comprises applying a front-side metal paste on the antireflective coating disposed on the front-side of the silicon wafer followed by drying. For example, FIG. 3 shows a layer of front-side metal paste 350 disposed over the antireflective coating (ARC) layer 330 on the front-side 301 of the silicon wafer 300. Suitable front-side metal pastes 350 include silver paste. In some embodiments, the drying of the back-side aluminum paste 360 and the front-side metal paste 350 is done in a single step. In other embodiments, the drying of the back-side aluminum paste 360 and the front-side metal paste 350 is done sequentially following each step of application.

Figure 4:
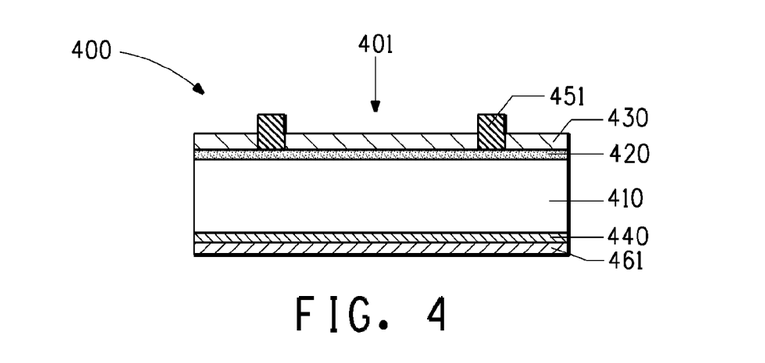
FIG. 4 schematically illustrates a cross-sectional view of an exemplary solar cell.

The process of forming a silicon solar cell further comprises firing the silicon wafer with front-side metal paste and back-side aluminum paste at a peak temperature in the range of 600° C. to 950° C. to form a solar cell, such as solar cell 400 shown in FIG. 4. In some cases, the step of firing is done after the application of both the back-side aluminum paste and the front-side metal paste, such that the drying of the aluminum paste and the front-side metal paste is part of the step of firing. The firing of the back-side aluminum paste and the front-side metal paste results in the formation of an aluminum back electrode and a metal front electrode such as, aluminum back electrode 461 and metal front electrode 451 as shown in FIG. 4.

During the firing process, the molten aluminum from the back-side aluminum paste 360 dissolves a portion of the silicon of the p-type region 310 and on cooling forms a p+ layer that epitaxially grows from the p-type region 310 of the silicon wafer 300, forming a p+ layer comprising a high concentration of aluminum dopant. In addition, a portion of the molten aluminum-silicon melt forms a continuous layer of the eutectic composition (approximately 12% Si and 88% Al) disposed between the p+ layer and the remaining aluminum particles. Thus the aluminum back electrode 461 may comprise a eutectic layer (not shown) in contact with the p+ layer 440 and an outer layer of particulate aluminum. For example, FIG. 4 shows a p+ layer 440 disposed on the p-type region 410 and the aluminum back electrode 461 disposed at the surface of the p+ layer 440. The p+ layer 440 is also called the back surface field layer, and helps to improve the energy conversion efficiency of the solar cell 400.

Firing is performed, for example, for a total amount of time in the range of 1 minute to 5 minutes at a peak temperature in the range of 600° C. to 950° C. Firing can be carried out using single or multi-zone belt furnaces, in particular, multi-zone IR belt furnaces. Firing is generally carried out in the presence of oxygen, in particular, in the presence of air. During firing, the organic substances, including non-volatile organic materials and the organic portions not evaporated during the optional drying step, are substantially removed, i.e., burned away and/or carbonized. The organic substances removed during firing comprise organic solvent(s), optional organic polymer(s), optional organic additive(s), and the organic moieties of the one or more optional alkaline earth organometallic compounds. If present, the alkaline earth organometallic compounds typically remains as an alkaline earth oxide and/or hydroxide after firing In some embodiments, a back-side silver or silver/aluminum paste (not shown) is applied over the back-side aluminum paste 360 and fired at the same time, becoming a silver or silver/aluminum back electrode (not shown). During firing, the boundary between the back-side aluminum and the back-side silver or silver/aluminum assumes an alloy state. The aluminum electrode accounts for most areas of the back electrode, owing in part to the need to form a p+ layer 440. Since soldering to an aluminum electrode is impossible, a silver or silver/aluminum back electrode is formed over portions of the back-side (often as 2 to 6 mm wide busbars) as an electrode for interconnecting solar cells by means of pre-soldered copper ribbon or the like.

In addition, during the firing process, the front-side metal paste 350 can sinter and penetrate through the antireflective coating layer 330, and is thereby able to electrically contact the n-type region 320. This type of process is generally called "firing through". This fired-through state is apparent in the metal front electrode 451 of FIG. 4.

FIG. 4 schematically illustrates a cross-sectional view of an exemplary solar cell 400 formed by the process disclosed hereinabove. As shown in FIG. 4, the solar cell 400 comprises a p-type silicon substrate including a p-type region 410 disposed between an n-type region 420 and a p+ layer 440, wherein the p+ layer 440 comprises silicon doped with boron and aluminum. The p-type silicon substrate is either a single crystalline silicon substrate or a polycrystalline silicon substrate. The solar cell 400 also includes an aluminum back electrode 461 disposed on the p+ layer 440, wherein the aluminum back electrode 461 comprises boron nitride and aluminum. In some cases, the boron nitride can be present in the aluminum back electrode 461 in the range of 0.01% to 10% or 0.1% to 6%, by weight, based on the total weight of the aluminum back electrode 461. In some embodiments, the aluminum can be present in the aluminum back electrode 461 in the range of 90% to 99.99%, or 94% to 99.9%, by weight, based on the total weight of the aluminum back electrode 461.

As shown in FIG. 4, the front-side or the sun-side 401 of the solar cell 400 further comprises a metal front electrode 451 disposed on a portion of the n-type region 420 and an antireflective coating (ARC) layer 430 disposed on another portion of the n-type region, wherein another portion is the portion of the n-type region not covered by the metal front electrode 451.

In some embodiments, the use of the hereinabove disclosed aluminum paste compositions comprising boron nitride in the production of aluminum back electrodes of silicon solar cells can result in silicon solar cells exhibiting improved cell voltage ($U_{oc}$) and cell efficiency ($E_{ff}$), without impacting the cell bowing, as compared to solar cells formed using aluminum paste without any boron nitride.

As used herein, the terms "comprises," "comprising," "includes," "including," "has," "having" or any other variation thereof, are intended to cover a non-exclusive inclusion. For example, a composition, process, method, article, or apparatus that comprises a list of elements is not necessarily limited to only those elements but may include other elements not expressly listed or inherent to such composition, process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), or both A and B are true (or present).

As used herein, the phrase "one or more" is intended to cover a non-exclusive inclusion. For example, one or more of A, B, and C implies any one of the following: A alone, B alone, C alone, a combination of A and B, a combination of B and C, a combination of A and C, or a combination of A, B, and C.

Also, use of "a" or "an" are employed to describe elements and described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the disclosed compositions, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

In the foregoing specification, the concepts have been disclosed with reference to specific embodiments. However, one of ordinary skill in the art appreciates that various modifications and changes can be made without departing from the scope of the invention as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all embodiments.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

The concepts disclosed herein will be further described in the following examples, which do not limit the scope of the invention described in the claims.

The examples cited here relate to aluminum paste compositions used to form back-side contact in conventional solar cells.

The aluminum paste compositions can be used in a broad range of semiconductor devices, although they are especially effective in light-receiving elements such as photodiodes and solar cells. The discussion below describes how a solar cell is formed using the aluminum paste composition(s) disclosed herein, and how the solar cell is tested for cell bowing, cell efficiency and paste adhesion.

Unless specified otherwise, compositions are given as weight percents.

EXAMPLES

Preparation of Glass Frit-Free Back-Side Paste Aluminum Paste Compositions

A master batch of 250 to 1000 g of aluminum paste was first made and small portions were taken out from the master batch to prepare exemplary pastes comprising boron nitride and comparative pastes comprising other additives.

Preparation of Master Batch Aluminum Paste A

A batch of 260 g of aluminum paste A was made as follows:

First, a pre-wet aluminum slurry was made by mixing 80 wt % air-atomized nodular aluminum powder (greater than 99.7 weight % Al, having average particle size of 6 microns) and 20 wt % organic vehicle 1 (OV1). OV1 included 43.5% terpineol solvent, 43.5% dibutyl carbitol, 7.5% oleic acid, and 5.5% ethyl cellulose (48.0-49.5% ethoxyl content). Then, a pre-paste mixture was formed by mixing: 240.5 g of the pre-wet aluminum slurry with 6.5 g of organic vehicle 2 (OV2); 1.3 g of epoxidized octyl tallate; 0.8 g of polyunsaturated oleic acid; and 2.6 g of a mixture of wax and hydrogenated castor oil. OV2 included 46.7% terpineol solvent, 40.9% dibutyl carbitol, and 12.4% ethyl cellulose (49.6-51.5% ethoxyl content). The pre-paste mixture was further mixed using a planetary centrifugal mixer, THINKY ARE-310 (THINKY USA, Inc., Laguna Hills, Calif.) for 30 seconds at 2000 rpm. The mixing process was repeated for two more times to ensure uniform mixing to form a pre-paste. The pre-paste was then dispersed using a high shear mixer, Dispermat® TU-02 (VMA-Gwetzmann GMBH, Reichshof, Germany) at 1800 rpm to 2200 rpm for 3 minutes. The pre-paste was also stirred by hand to eliminate possible unmixed areas at the side, and the mixing with the Dispermat® TU-02 was repeated two more times to ensure uniformity. The aluminum content of the pre-paste was measured in duplicate by weighing small quantities (1-2 g) into an alumina boat and firing in a muffle furnace at 450° C. for 30 min to remove organics, and reweighing to obtain the residual aluminum weight. The pre-paste was found to have 76.44% aluminum by weight, which was above the desired range of 73% to 76%, by weight, based on total weight of the aluminum paste composition. The viscosity of the pre-paste was measured using a Brookfield HADV-I Prime viscometer (Brookfield Engineering Laboratories, Inc., Middleboro, Mass.) with the thermostatted small-sample adapter at 10 rpm and was found to be 83 Pa·s. To achieve the desired weight % and viscosity range, 0.65 g of organic vehicle 3 (OV3) (a 50/50 blend of terpineol solvent and dibutyl carbitol) and 7.2 g of OV2 were added to the pre-paste and mixed again using Dispermat® to obtain the master batch paste A. The viscosity of the master batch paste A was measured the following day using a Brookfield HADV-I Prime viscometer with the thermally controlled small-sample adapter at 25° C. and was found to be 104 Pa·s at 10 rpm. The final solid content of the master batch paste A was found to be 73.98 weight %.

Master batch paste A was measured for fineness of grind (FoG) to qualify for the printability using gage #5251 (Precision Gage and Tool Co., Dayton, Ohio) with the specification range of 0-25 microns. A small amount (dot) of the master batch paste A was applied on both grooves of the gage at the 25 microns mark end. A scraper was placed above the dot and with high and uniform pressure, the paste was drawn down in a continuous band toward towards the 0 micron end. The readings of maximum particle size (beginning of fourth continuous scratch and the point where 50% of the band has been scratched away) on both sides grooves within 10 seconds of paste draw-down were measured as 22 microns and 17 microns, meeting the good printability specification of under 50 microns and 20 microns, respectively.

Preparation of Master Batch Aluminum Paste B

A similar procedure was used to make master batch paste B using nitrogen-atomized spherical aluminum powder (average particle size of 7.3 microns; 99.7% weight Al; Iron content less than 0.2% weight) resulting in 76.15 weight % solid content and viscosity of 58.8 Pa·s at 10 rpm.

Preparation of Additive Aluminum Pastes

Exemplary aluminum paste composition comprising 3% boron nitride (BN), by weight, based on the total solid (aluminum and boron nitride) content, was prepared by mixing 28.13 g of master batch paste A; 0.207 g of OV2; 0.023 g of OV3; and 0.64 g of boron nitride, using high shear mixer DISPERMET® TU-02 at 1800 rpm to 2200 rpm for 3 minutes. The boron nitride, (NX1 grade from Momentive Performance Materials, Inc, NY) was dried overnight at 150° C. in nitrogen before use. This exemplary paste is referred to herein as 3 weight % BN additive paste.

Another exemplary aluminum paste composition comprising 1% boron nitride (BN), by weight, based on the total solid (aluminum and boron nitride) content was prepared by blending 9 g of 3 weight % BN additive paste, prepared as above, with 18 g of master batch paste A using a THINKY centrifugal mixer three times, for 30 seconds at 2000 rpm speed each time. This exemplary paste is referred to herein as 1 weight % BN additive paste.

Similarly, an exemplary aluminum paste composition comprising 0.33% boron nitride, by weight, based on the total solid (aluminum and boron nitride) content was prepared by blending 7 g of 1 weight % BN additive paste, prepared as above, with 14 g of master batch paste A using a THINKY centrifugal mixer three times, for 30 seconds at 2000 rpm speed each time.

Similar procedures were used to make other exemplary pastes comprising boron nitride and master batch pastes B and C, and comparative pastes comprising additives such as, boron (B), boron oxide ($B_2O_3$), aluminum boride ($AlB_2$), triethylborate (TEB), and boron phosphate ($BPO_4$) with master batch paste A. For all paste compositions used herein to make solar cells for measuring electrical performance and bowing, the weight % of the additive reported is based on the total solid content (aluminum+additive) of the aluminum paste composition. Hence, in Example 1.1 (see Table 1), 1 weight % boron nitride indicates that the aluminum:boron nitride weight ratio was 99:1 and the back-side paste comprised 73.26% aluminum and 0.74% boron nitride, by weight, based on the final solid content of 74 weight % of the master batch aluminum paste A.

Formation of Solar Cells

Exemplary solar cells were fabricated starting with p-type polycrystalline silicon wafers having a thickness of 160 microns or 200 microns. The silicon wafers had a nominal base resistivity of 1 Ohm/sq, an emitter resistivity of 65 Ohm/sq, and a hydrogen-containing silicon nitride ($SiN_x$:H) antireflective coating formed by plasma enhanced chemical vapor deposited (PECVD). The 152 mm×152 mm silicon wafers were further cut into 28 mm×28 mm wafers using a diamond saw, and then cleaned.

Aluminum pastes of Example 1 were printed onto the back-side of the silicon wafers using a screen (Sefar Inc., Depew, N.Y.) with a square opening of 26.99 mm×26.99 mm and a screen printer model MSP 885 (Affiliated Manufacturers Inc., North Branch, N.J.). This left a nominal 0.5 mm border of bare Si (i.e., without Al) around the edges. Each wafer was weighed before and after the application of aluminum paste to determine a net weight of applied aluminum paste on the silicon wafer. The wet weight of Al paste was targeted to be 55 mg, which produced an Al loading after firing of 5.6 mg Al/cm$^2$. The aluminum paste was dried in a mechanical convection oven with vented exhaust for 30 minutes at 150° C., resulting in a dried film thickness of 30 microns.

Then, a silver paste either Solamet® PV159 or Solamet® PV145 (E. I. du Pont de Nemours and Company, Wilmington, Del.) was screen printed using a screen (Sefar Inc., Depew, N.Y.) and a screen printer model MSP 485 (Affiliated Manufacturers Inc., North Branch, N.J.) on the silicon nitride layer on the front surface of the silicon wafer and dried at 150° C. for 20 minutes in a convection oven to give 20-30 microns-thick silver grid lines and a bus bar. The screen printed silver paste had a pattern of eleven fingers/grid lines of 100-140 microns width connected to a bus bar of 1.25 mm width located near one edge of the cell.

The printed and dried silicon wafers were then fired in an IR furnace PV614 reflow oven (Radiant Technology Corp., Fullerton, Calif.) at a belt speed of 457 cm/minute (or 180 inch/minute). The furnace had six heated zones, and the zone temperatures used were zone 1 at 550° C., zone 2 at 600° C., zone 3 at 650° C., zone 4 at 700° C., zone 5 at 800° C., and the final heated zone 6 set at peak temperature in the range of 840-940° C. The wafers took 33 sec to pass through all of the six heated zones with 2.5 sec each in zone 5 and zone 6. The wafers reached peak temperatures lower than the zone 6 set, in the range of 740-840° C. The zone 6 set point temperature is the cell firing temperature referred to in Table 1. After firing, the metallized wafer became a functional photovoltaic device.

All control, exemplary, and comparative solar cells were made in groupings denoted as "series". Within a series, all cells were printed with the aluminum pastes and the silver pastes on the same day, and all cells were fired together on the same day.

Each aluminum paste composition gave an efficiency which became maximized at a firing temperature which might be different for the different paste compositions. For each aluminum paste composition within a series, a number of duplicate solar cells were fabricated. These solar cells were then divided into 3 or 4 groups, and all the solar cells in each group (typically 3 to 6 wafers per group) were fired at the same temperature. The firing temperatures for the different groups were in the range of 850° C. to 925° C. at about 25° C. increment. For each firing temperature, the median efficiency of the solar cells in that group was determined. The firing temperature which gave the maximum median efficiency for that aluminum paste was selected and reported in the Table 1. Table 1 summarizes the exemplary solar cells formed for measuring electrical characteristics with maximum median efficiency.

TABLE 1

Solar cells formed using exemplary aluminum paste compositions

| Example # | Back-side Paste (weight % based on the total solid content) | Thickness of silicon wafer (microns) | Firing Temperature (° C.) | Front-side Paste |
|---|---|---|---|---|
| Series 100 | | | | |
| Control 1 | Paste A | 200 | 875 | PV145 |
| 1.1 | Paste A with 1% BN | 200 | 900 | PV145 |
| 1.2 | Paste A with 3% BN | 200 | 900 | PV145 |
| Series 200 | | | | |
| Control 2 | Paste A | 160 | 885 | PV159 |
| 2.1 | Paste A with 0.33% BN | 160 | 885 | PV159 |
| 2.2 | Paste A with 1% BN | 160 | 885 | PV159 |
| 2.3 | Paste A with 3% BN | 160 | 860 | PV159 |
| Series 300 | | | | |
| Control 3 | Paste B | 160 | 885 | PV159 |
| 3.1 | Paste B with 0.33% BN | 160 | 860 | PV159 |
| 3.2 | Paste B with 1% BN | 160 | 885 | PV159 |

Comparative Table 1 summarizes the comparative solar cells formed for measuring electrical characteristics. The comparative solar cells were formed using aluminum pastes comprising additives such as, boron (B), boron oxide ($B_2O_3$), aluminum boride ($AlB_2$), triethylborate (TEB), and boron phosphate ($BPO_4$).

COMPARATIVE TABLE 1

Solar cells formed using comparative aluminum paste compositions

| Comparative Example # | Back-side Paste (weight % based on the total solid content) | Thickness of silicon wafer (microns) | Firing Temperature (° C.) | Front-side Paste |
|---|---|---|---|---|
| Series 400 | | | | |
| Control A | Paste A | 160 | 900 | PV159 |
| A.A | Paste A with 1% $B_2O_3$ | 160 | 900 | PV159 |
| Series 500 | | | | |
| Control B | Paste A | 160 | 900 | PV145 |
| B.A | Paste A with 0.1% B | 160 | 900 | PV145 |
| B.B | Paste A with 0.3% TEB | 160 | 850 | PV145 |
| B.C | Paste A with 1% $AlB_2$ | 160 | 850 | PV145 |
| Series 600 | | | | |
| Control C | Paste A | 160 | 875 | PV145 |
| C.A | Paste A with 0.5% $BPO_4$ | 160 | 875 | PV145 |

Evaluation of the Electrical Performance of Solar Cells

A commercial Current-Voltage (JV) tester ST-1000 (Telecom-STV Ltd., Moscow, Russia) was used to make efficiency measurements of the polycrystalline silicon solar cells prepared supra. Two electrical connections, one for voltage and one for current, were made on the top and the bottom of each of the solar cells. Transient photoexcitation was used to avoid heating the silicon solar cells and to obtain JV curves under standard temperature conditions (25° C.). A flash lamp with a spectral output similar to the solar spectrum illuminated the solar cells from a vertical distance of 1 m. The lamp power was held constant for 14 milliseconds. The intensity at the sample surface, as calibrated against external solar cells was 1000 W/m$^2$ (or 1 Sun) during this time period. During the 14 milliseconds, the JV tester varied an artificial electrical load on the sample from short circuit to open circuit. The JV tester recorded the light-induced current through, and the voltage across, the solar cells while the load changed over the stated range of loads. A power versus voltage curve was obtained from this data by taking the product of the current times the voltage at each voltage level. The maximum of the power versus voltage curve was taken as the characteristic output power of the solar cell for calculating solar cell efficiency. This maximum power was divided by the area of the sample to obtain the maximum power density at 1 Sun intensity. This was then divided by 1000 W/m² of the input intensity to obtain the efficiency which is then multiplied by 100 to present the result in percent efficiency. Other parameters of interest were also obtained from this same current-voltage curve. Of special interest were: the open circuit voltage ($U_{oc}$), which is the voltage where the current is zero; the short circuit current ($I_{sc}$), which is the current when the voltage is zero, and, for reasonably efficient cells, estimates of the series ($R_a$) and shunt ($R_{sh}$) resistances were obtained from the reciprocal of the local slope of the current voltage curve near the short circuit and open circuit points, respectively.

As explained earlier, only those aluminum paste compositions are reported in the Table 2 which gave the maximum median efficiency at the reported firing temperature listed in Table 1. Furthermore, Table 2 lists the median values of ΔEff and $\Delta U_{oc}$ obtained for the cells fired at the temperature listed. The ΔEff ($X_{Max}$–$Ctrl_{Max}$) is the difference between the highest median cell efficiency of the paste containing boron nitride and other optional glass frit-free additives, and the control paste containing no boron nitride but other optional glass frit-free additives. The median voltage corresponding to the highest median cell efficiency is taken to determine $\Delta U_{oc}$ ($X_{Max}$–$Ctrl_{Max}$). A positive number indicates improvement in cell performance, while a negative number indicates poor performance relative to the control.

TABLE 2

Electrical performance of exemplary solar cells

| Example # | Back-side Paste (weight % based on the total solid content) | Median Efficiency | Δ Eff ($X_{Max}$–$Ctrl_{Max}$) | Median $U_{oc}$ (mV) | $\Delta U_{oc}$ ($X_{Max}$–$Ctrl_{Max}$) |
|---|---|---|---|---|---|
| Series 100 | | | | | |
| Control 1 | Paste A | 14.43 | | 601 | |
| 1.1 | Paste A with 1% BN | 14.82 | 0.39 | 605 | 4 |
| 1.2 | Paste A with 3% BN | 14.7 | 0.27 | 606 | 5 |
| Series 200 | | | | | |
| Control 2 | Paste A | 14.31 | | 602 | |
| 2.1 | Paste A with 0.33% BN | 14.62 | 0.31 | 606 | 4 |
| 2.2 | Paste A with 1% BN | 14.74 | 0.43 | 608 | 6 |
| 2.3 | Paste A with 3% BN | 14.86 | 0.55 | 608 | 6 |
| Series 300 | | | | | |
| Control 3 | Paste B | 14.33 | | 604 | |
| 3.1 | Paste B with 0.33% BN | 14.54 | 0.21 | 606 | 2 |
| 3.2 | Paste B with 1% BN | 14.4 | 0.06 | 604 | 0 |

COMPARATIVE TABLE 2

Electrical performance of comparative solar cells

| Comparative Example # | Back-side Paste (weight % based on the total solid content) | Median Efficiency | Δ Eff ($X_{Max}$–$Ctrl_{Max}$) | Median $U_{oc}$ (mV) | $\Delta U_{oc}$ ($X_{Max}$–$Ctrl_{Max}$) |
|---|---|---|---|---|---|
| Series 400 | | | | | |
| Control A | Paste A | 14.1 | | 604 | |
| A.A | Paste A with 1% $B_2O_3$ | 13.68 | –0.42 | 597 | –7 |
| Series 500 | | | | | |
| Control B | Paste A | 14.48 | | 607 | |
| B.A | Paste A with 0.1% B | 13.99 | –0.49 | 604 | –3 |
| B.B | Paste A with 0.3% TEB | 14.38 | –0.1 | 607 | 0 |
| B.C | Paste A with 1% $AlB_2$ | 14.34 | –0.15 | 606 | –1 |
| Series 600 | | | | | |
| Control C | Paste A | 14.65 | | 0.606 | |
| C.A | Paste A with 0.5% $BPO_4$ | 14.61 | –0.04 | 602 | –4 |

Table 2 clearly shows that the addition of up to 3 weight % of boron nitride to the aluminum paste results in an increase in open circuit voltage ($U_{oc}$) and also the efficiency of the solar cells. In comparison, as shown in the Comparative Table 2, other boron containing compounds, such as boron, boron oxide ($B_2O_3$), aluminum boride ($AlB_2$), triethylborate (TEB), and boron phosphate ($BPO_4$) resulted in a decrease in the efficiency and a decrease or no change in open circuit voltage of the solar cells.

Formation of Solar Cell Wafers for Bowing Determination

For the cell bowing measurements, a rectangular 14 mm×65 mm cell design was chosen to amplify any observed bowing.

The glass frit-free back-side aluminum paste A prepared supra was screen printed onto the back-side of the rectangular silicon wafers using a screen (Sefar Inc., Depew, N.Y.) with a rectangular opening of 13 mm×64 mm and a screen printer, MSP 885 (Affiliated Manufacturers Inc., North Branch, N.J.). This left a nominal 0.5 mm border of bare Si (i.e., without Al) around the edges. Each wafer was weighed before and after the application of aluminum paste to determine a net weight of applied aluminum paste on the wafer. The wet weight of Al paste A was targeted to be 63 mg, which produced an Al loading after firing of 5.6 mg Al/cm². The aluminum paste A coated silicon wafers were dried in a mechanical convection oven with vented exhaust for 30 minutes at 150° C., resulting in a dried film thickness of 30 microns. No front-side paste was screen printed on silicon wafers used in the bow measurements.

The aluminum paste printed rectangular cells were fired in a 4-zone furnace (BTU International, North Billerica, Mass.; Model PV309) at a belt speed of 221 cm/minute (or 87 inch/minute) with zone temperatures set as zone 1 at 610° C., zone 2 at 610° C., zone 3 at 585° C., and the final zone 4 set at peak temperature in the range of 860° C. to 940° C. The wafers took 5.2 sec to pass through zone 4. The 4-zone BTU furnace uses radiant heating from quartz lamps. The temperature ramp-up profile was kept the same as for the 6-zone IR furnace PV614 reflow oven detailed supra to facilitate a reproducible organics burn-out. The set point of the last zone (zone 4) was varied to ensure optimal contact formation. The set point of this last hot zone is referred to as the "firing temperature". The total length of the 4-zone BTU furnace is half that of the 6-zone RTC PV614 furnace, but the differences in belt speeds compensated to make the firing times similar.

Bowing Measurement of the Solar Cell Wafers

A jig was made to facilitate easy and accurate cell bowing measurement of solar cell wafers prepared supra. The jig consisted of a 30.48 cm×30.48 cm table, with legs of 15.24 cm. The table top was flat, and had 1 cm hole in the middle. To facilitate the measurement, the hole was tapered so that the hole size on the bottom of the table top was larger than the hole size on the top. The measurement head of a Keyence LC-2001 (Mississauga, Ontario, CANADA) Laser Displacement Meter was mounted to the underside of the table top held by a micrometer driven translation stage. The laser displacement meter's light beam projected straight upward through the hole in the table top. The flat surface of the table top is used as the reference plane for the bow measurement. Prior to taking measurements the vertical location of the LC-2001 was adjusted with the micrometer driven translation stage such that the meter read zero when a known flat sample was placed on the table top over the hole. Then, a solar cell wafer prepared supra was placed on the table top such that its center was centered over the hole. The LC-2001 then reads out the displacement from the table top flat surface in microns with accuracy of ±1 micron (i.e. ±0.001 mm).

Table 3 summarizes the bowing results for aluminum paste A that contained boron nitride or other boron compounds and which were printed on wafers having a thickness of 160 microns. The control paste had no boron nitride or other boron additives. Three to five samples for each firing temperature were tested and the median data corresponding to the optimum cell firing temperature with respect to cell efficiency are presented in Table 3. "Series" in Table 3 refers to each individual test group and the corresponding control sample.

TABLE 3

Bowing characteristics of exemplary solar cell wafers

| Example # | Back-side Paste (weight % based on the total solid content) | Firing Temperature (° C.) | Median Solar Cell Bowing (mm) |
|---|---|---|---|
| | Series 700 | | |
| Control 4 | Paste A | 920 | 0.628 |
| 4.1 | Paste A with 0.33% BN | 920 | 0.551 |
| 4.2 | Paste A with 1% BN | 920 | 0.495 |
| 4.3 | Paste A with 3% BN | 920 | 0.45 |

COMPARATIVE TABLE 3

Cell bowing characteristics of comparative solar cells

| Comparative Example # | Back-side Paste (weight % based on the total solid content) | Firing Temperature (° C.) | Median Solar Cell Bowing (mm) |
|---|---|---|---|
| | Series 800 | | |
| Control D | Paste A | 900 | 0.452 |
| D.A | Paste A with 0.33% TEB | 900 | 0.741 |
| D.B | Paste A with 1% TEB | 900 | 0.781 |
| Control E | Paste A | 900 | 0.452 |
| E.A | Paste A with 0.33% B | 900 | 0.875 |
| E.B | Paste A with 1% B | 900 | 0.988 |
| E.C | Paste A with 3% B | 900 | 0.915 |

As can be seen from Table 3, addition of boron nitride additive to the aluminum paste A decreased cell bowing. The median cell bowing was reduced up to 28% and 20% with aluminum paste A containing 3 weight % and 1 weight % of boron nitride additive respectively. In comparison, other additives such as triethylborate (TEB) and boron (B) increased the cell bowing, as shown in the Comparative Table 3.

Paste Adhesion Test

Aluminum pastes need to have good adhesion to the silicon wafer to qualify for commercial application. Hence, cohesive strength of the Al metallizations formed using exemplary aluminum paste compositions was tested using a peel test on solar cells fabricated as described above. A transparent layer of adhesive tape (SCOTCH Magic® Tape, 3M Corp.) was gently placed across the backside (aluminum side) of the fired cell, and a uniform finger pressure was applied smoothly to insure good bonding of the tape to the fired paste. The tape was then peeled back in an upward motion and checked for the evidence of paste transfer by sticking the tape onto clean white printing paper. The appearance of the tape as transparent or substantially transparent indicated good adhesion and was recorded as "Pass". The appearance of the tape as cloudy to substantially opaque indicated poor adhesion and was recorded as "Fail." Results of the peel tests are shown in the Table 4.

TABLE 4

Adhesion test results of exemplary solar cells

| Example # | Back-side Paste (weight % based on the total solid content) | Firing Temperature (° C.) | Peel Test |
|---|---|---|---|
| | Series 200 | | |
| Control 6 | Paste A | 910 | Pass |
| 6.1 | Paste A with 0.33% BN | 910 | Pass |
| 6.2 | Paste A with 1% BN | 910 | Pass |
| 6.3 | Paste A with 3% BN | 910 | Pass |
| | Series 300 | | |
| Control 76 | Paste B | 900 | Pass |
| 7.1 | Paste B with 0.33% BN | 900 | Pass |
| 7.2 | Paste B with 1% BN | 900 | Pass |
| 7.3 | Paste B with 3% BN | 900 | Pass |

As can be seen in Table 4, the presence of boron nitride in the aluminum paste compositions did not adversely affect the adhesion characteristics of the exemplary glass frit-free aluminum paste compositions including boron nitride.

What is claimed is:

1. A process of forming a silicon solar cell comprising
  (a) providing an aluminum paste composition consisting essentially of;
    i. 0.003% to 9% by weight of boron nitride;
    ii. 27% to 89%, by weight of an aluminum powder, such that the weight ratio of aluminum powder to boron nitride is in the range of 9:1 to 9909:1;
    iii. 0.1% to 9%, by weight of an optional glass frit-free additive wherein the optional glass frit-free additive comprises amorphous silicon dioxide, crystalline calcium oxide, organometallic compounds, metal salts, or mixtures thereof; and
    iv. 10% to 70%, by weight of an organic vehicle, wherein the organic vehicle comprises an organic solvent and an organic polymer,
      wherein the aluminum paste composition excludes a glass frit, and
      wherein the amounts in % by weight are based on the total weight of the aluminum paste composition;
  (b) applying the aluminum paste on a back-side of a p-type silicon substrate;

(c) applying a metal paste on a front-side of the p-type silicon substrate, the front-side being opposite to the back-side;

(d) firing the p-type silicon substrate after the application of the aluminum paste at a peak temperature in the range of 600° C. to 950° C.; and (e) firing the p-type silicon substrate after the application of the metal paste at a peak temperature in the range of 600° C. to 950° C.

2. The process of forming a silicon solar cell according to claim 1, wherein the step of applying the aluminum paste on a back-side of a p-type silicon substrate comprises screen printing the aluminum paste on the back-side of the p-type silicon substrate.

3. The process of forming a silicon solar cell according to claim 1, wherein the boron nitride is present in the aluminum paste in an amount ranging from 0.005% to 8%, by weight.

4. The process of forming a silicon solar cell according to claim 1, wherein the aluminum powder is present in the aluminum paste in an amount ranging from 45% to 79%, by weight.

5. The process of forming a silicon solar cell according to claim 1, wherein the aluminum powder comprises nodular aluminum, spherical aluminum, flake aluminum, irregularly-shaped aluminum, or mixtures thereof.

6. The process of forming a silicon solar cell according to claim 1, wherein the step (d) of firing the p-type silicon substrate after the application of the aluminum paste and the step (e) of firing the p-type silicon substrate after the application of the metal paste are done at the same time.

* * * * *